(12) United States Patent
Robinson (10) Patent No.: US 7,650,767 B2
(45) Date of Patent: Jan. 26, 2010

(54) LOCK RING FOR A WATTHOUR METER APPLICATION

(75) Inventor: Darrell Robinson, Highland, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 0 days.

(21) Appl. No.: 11/739,339

(22) Filed: Apr. 24, 2007

(65) Prior Publication Data

US 2008/0266761 A1    Oct. 30, 2008

(51) Int. Cl.
B65D 55/14    (2006.01)
(52) U.S. Cl. .............................. 70/34; 70/164; 70/386; 70/461; 292/256.6; 292/DIG. 60
(58) Field of Classification Search ............... 70/164, 70/461, 34, 386; 292/256.6, 256.61, 256.63, 292/256.65, 256.67, 256.69, DIG. 60, DIG. 63
See application file for complete search history.

(56) References Cited

U.S. PATENT DOCUMENTS

| | | | |
|---|---|---|---|
| 2,643,150 A | 6/1953 | Giles | |
| 2,651,094 A | 9/1953 | Dodge | |
| 2,688,170 A | 9/1954 | Balzer | |
| 2,787,039 A | 4/1957 | Krasberg | |
| 2,943,876 A * | 7/1960 | Morris | 403/313 |
| 2,968,508 A | 1/1961 | Campbell et al. | |
| 3,154,829 A | 11/1964 | Pahel et al. | |
| 3,172,282 A | 3/1965 | Heckrotte | |
| 3,259,414 A | 7/1966 | Rothert | |
| 3,265,426 A | 8/1966 | Brooks et al. | |
| 3,396,439 A | 8/1968 | Schaub | |
| 3,737,959 A | 6/1973 | Smith | |
| 3,835,674 A * | 9/1974 | Hoyt | 70/34 |
| 3,867,822 A * | 2/1975 | Morse et al. | 70/164 |
| 3,907,349 A * | 9/1975 | Kane | 292/256.67 |
| 4,008,585 A * | 2/1977 | Lundberg | 70/164 |
| 4,134,609 A | 1/1979 | Santoni | |
| 4,158,953 A | 6/1979 | Nielsen, Jr. | |
| 4,225,165 A | 9/1980 | Kesselman | |
| 4,226,102 A * | 10/1980 | Mattress, Jr. | 70/164 |
| 4,310,956 A * | 1/1982 | Meckstroth et al. | 24/279 |
| 4,329,860 A | 5/1982 | Moberg | |
| 4,331,012 A * | 5/1982 | Swisher | 70/164 |
| 4,422,679 A | 12/1983 | Ruscitto | |
| 4,531,770 A | 7/1985 | Mattress, Jr. | |
| 4,632,438 A * | 12/1986 | McKinney | 292/87 |
| 4,702,093 A | 10/1987 | DeWalch | |
| 4,832,384 A * | 5/1989 | Venable | 292/87 |

(Continued)

*Primary Examiner*—Lloyd A Gall
(74) *Attorney, Agent, or Firm*—Young Basile Hanlon & MacFarlane, P.C.

(57) ABSTRACT

A lock ring for use in mounting a watthour meter, meter socket enclosure cover or a watthour meter socket adapter to each other. The lock ring includes a ring member and a housing carried on the first and second ends of the ring member. The housing may be separate housings carried on the first and second ends of the ring member. A lock is insertable into mated first and second housing members in one of a plurality of variably selectable positions that vary the circumference of the ring member to accommodate varied circumferences of watthour meters, meter socket adapters and meter socket enclosure cover mounting rings. Finger grips are formed on the housing members to facilitate closure of the housing. A plurality of axially spaced grooves are formed in one of the members for receiving lock members carried by the lock.

9 Claims, 9 Drawing Sheets

U.S. PATENT DOCUMENTS

| | | | |
|---|---|---|---|
| 4,934,747 A | 6/1990 | Langdon et al. | |
| 5,121,953 A | 6/1992 | Mahaney | |
| 5,184,119 A | 2/1993 | Stanbury et al. | |
| 5,226,302 A * | 7/1993 | Anderson | 70/159 |
| 5,227,668 A * | 7/1993 | Mutch et al. | 307/131 |
| 5,293,115 A | 3/1994 | Swanson | |
| 5,402,958 A * | 4/1995 | Mahaney | 242/388.1 |
| 5,423,695 A | 6/1995 | Robinson et al. | |
| 5,488,565 A | 1/1996 | Kennon et al. | |
| 5,523,559 A | 6/1996 | Swanson | |
| 5,542,722 A | 8/1996 | DeWalch | |
| 5,590,179 A | 12/1996 | Shincovich et al. | |
| 5,617,084 A | 4/1997 | Sears | |
| 5,851,038 A * | 12/1998 | Robinson et al. | 292/256.67 |
| 5,940,009 A | 8/1999 | Loy et al. | |
| 5,944,555 A | 8/1999 | Robinson et al. | |
| 6,032,989 A | 3/2000 | DeWalch et al. | |
| 6,041,627 A * | 3/2000 | Buckland | 70/78 |
| 6,054,930 A | 4/2000 | Guillon | |
| 6,118,269 A | 9/2000 | Davis | |
| 6,367,851 B1 * | 4/2002 | Davis | 292/256.6 |
| 6,406,974 B1 * | 6/2002 | Wu et al. | 438/420 |
| 6,435,576 B1 | 8/2002 | Kusta | |
| 6,439,010 B1 * | 8/2002 | Julicher | 70/164 |
| 6,684,670 B1 | 2/2004 | Agbay et al. | |
| 7,213,424 B2 | 5/2007 | Dewalch | |
| 2002/0074990 A1 * | 6/2002 | Shincovich | 324/110 |
| 2005/0285413 A1 | 12/2005 | Davidson | |
| 2006/0267355 A1 | 11/2006 | Stachowiak, Jr. | |
| 2006/0272369 A1 | 12/2006 | Stachowiak, Jr. | |
| 2007/0200365 A1 | 8/2007 | Stachowiak, Jr. et al. | |
| 2007/0249219 A1 | 10/2007 | Stachowiak, Jr. et al. | |

\* cited by examiner

LOCK RING FOR A WATTHOUR METER APPLICATION

BACKGROUND

The present invention relates, in general, to lock or sealing rings for mounting watthour meters on meter enclosures and, more particularly, to lock or sealing rings using barrel locks.

In the electric utility industry, watthour meters are employed to measure electrical power consumption at a residential or commercial building establishment. A cabinet is typically mounted on an outside wall of the residence or building and contains a meter socket having pairs of line and load contacts which are connected to electric power line conductors extending from the utility power network and electric load conductors connected to the residential or building establishment power distribution network. The contacts receive blade terminals on a plug-in watthour meter to complete an electric circuit through the meter between the line and load terminals mounted in the cabinet for the measurement of electrical power consumption.

Lock rings are commonly employed with ring-style sockets which have a circular flange projecting from the major plane of the socket cover for coupling a mating flange on a watthour meter to the socket cover to attach the watthour meter to the socket in a position where the blade terminals of the watthour meter are securely engaged with the electrical jaw contacts in the socket.

Watthour meter socket adapters which provide an extension between the blade terminals carried by the socket adapter and the socket jaw contacts to jaw contacts carried by the socket adapter which engage the meter blade terminals are also affixed to ring style meter socket covers by the same lock rings. When a socket adapter is used, a second lock ring is employed to mount the watthour meter to the outer end of the socket adapter.

The lock rings typically include an annular wall with radially inward extending side walls. The annular wall terminates in two spaced ends which may have perpendicularly extending flanges extending from each end, each with an aperture formed therein, extending from each end. The apertures for alignment to receive a seal or lock member to securely affix the lock ring to the meter/socket adapter/meter socket cover flanges and at the same time prevent easy removal or at a minimum provide evidence of tampering with the lock ring in an attempt to obtain non-metered power from the meter socket.

Plastic or wire seals have been employed to secure the ends of the lock ring together. However, such seals are easily cut. Barrel locks having a key operation provide greater security. In addition, when a barrel lock is employed on a lock ring, the lock ring is typically formed of a heavier gauge material to make it more difficult to cut the lock ring in an attempt to remove it from the meter socket/watthour meter flanges.

However, the heavier metal used in lock rings with barrel locks is more difficult to bend into a circular form. In addition, bending the perpendicular end flanges requires a second machine operation. Both factors contribute to a higher lock ring manufacturing cost.

Figure 11:
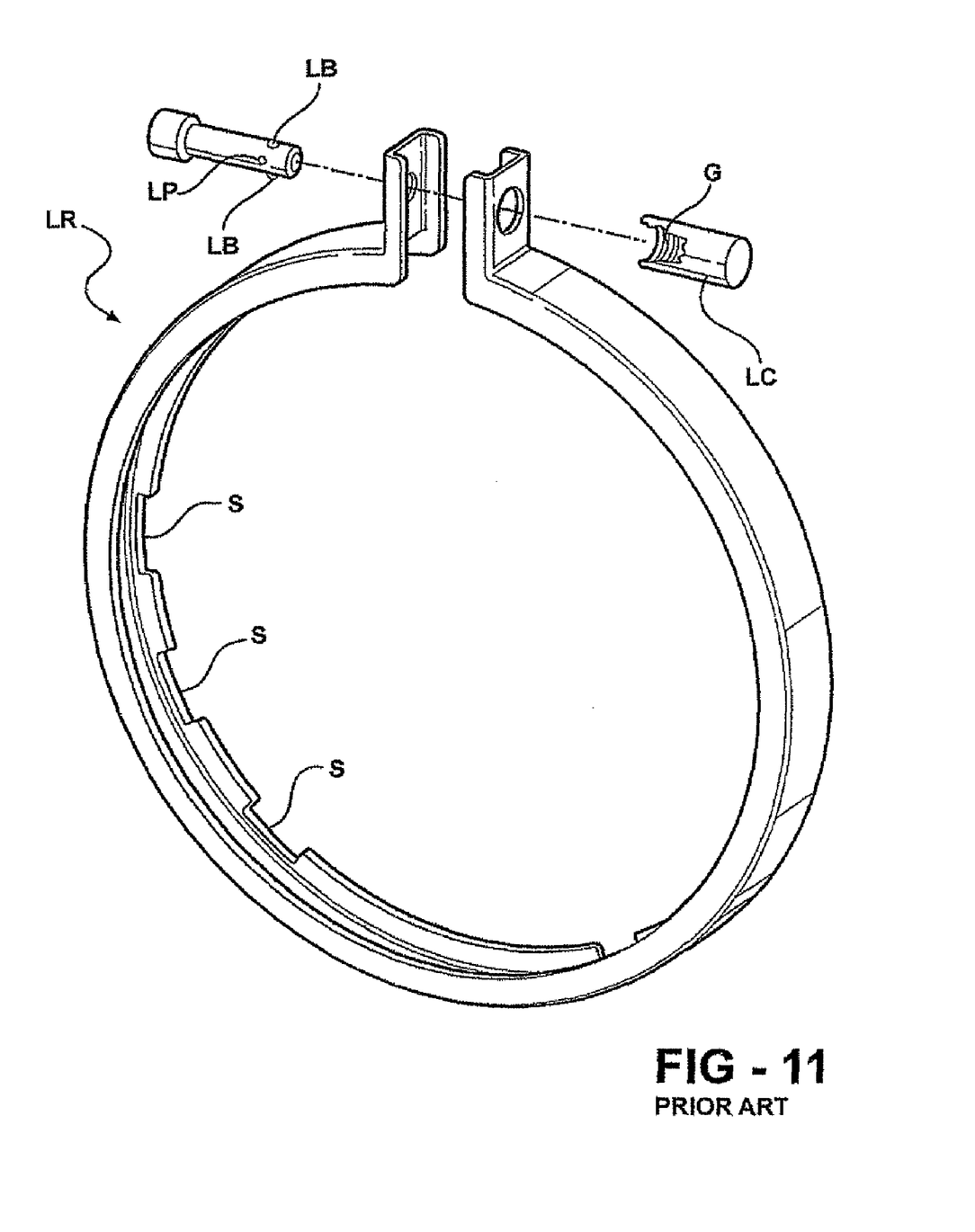
FIG. 11 is an exploded perspective view of a prior art lock ring and lock mechanism.

To make it easier to bend the heavier gage material, scallops or cutouts are formed in at least one of the radially inward extending sidewalls of the lock ring LR, shown in FIG. 11. However, the scallops provide a surface which can be forced into engagement with the socket or meter mounting flange and act as a thread which can enable the lock ring to be twisted off of the mating flanges to enable removal of the meter and access to the interior of the meter socket.

In addition, lock rings are used with meter socket cover rings and watthour meter/socket adapter mounting flanges which can, according to industry standards, vary up to 0.280 inches in circumference. As a result, lock rings are typically manufactured to the largest standard circumference of the meter socket mounting ring. However, when such lock rings are used with meter sockets, watthour meters or watthour meter socket adapters in which the mounting rings have a smaller circumference, the lock rings, even when locked, sloppily fit around the mounting flanges thereby increasing the opportunity for tampering.

In many prior art lock ring configurations, particularly those using a "barrel lock", a portion or all of the barrel lock itself is exposed to view when in the locked position. This provides an opportunity to tamper with the barrel lock in an effort to loosen or remove the sealing ring from the meter socket and obtain access to the interior of the socket.

One Prior Art attempt to address these security issues is shown in FIG. 11. In this lock ring LR, a lock pin LP with retractable and extendable locking balls LB are inserted through lined apertures on end flanges extending perpendicularly from opposed ends of the lock ring LR. The shank of the lock pin LP carrying the locking balls LB is inserted into a lock cap LC. The locking balls LB selectively engage one of a plurality of spaced grooves G formed interiorly within the lock cap LC to secure the lock ring LR tightly about the mounting flanges of a watthour meter, meter socket adapter or meter socket cover. However, this prior art lock ring still has several deficiencies. For one, the entire lock ring is exposed to view thereby enabling easy attempts to tamper with the lock ring or lock pin. Secondly, use of this lock pin LP and lock cap LC is difficult since the installer must hold the ends of the lock ring LR tightly about the mating mounting flanges, insert the lock pin LP through the aligned apertures in the ends of the lock ring LR while holding the lock cap LC in a position to receive the shank and lock balls LB of the lock pin LP. This assembly process is awkward at best.

Thus, it would be desirable to provide a lock ring for a watthour meter enclosure which can be made at a lower manufacturing cost, with fewer machine operations, and which provides a high level of security to thwart tampering attempts.

SUMMARY

A lock ring is disclosed for engagement with mounting flanges on a watthour meter, meter socket adapter and meter socket cover to join the watthour meter, meter socket adapter and/or the socket cover together.

In one aspect a watthour meter mounting apparatus is disclosed which includes a lock ring adapted for accepting a lock pin in which the lock ring has a plurality of lock positions for varying the circumference of the lock ring to accommodate varying circumference watthour meter mounting flanges.

The lock may include a head and a shank, with moveable lock members carried in the shanks. First and second housing members are engageably mounted on first and second ends of the lock ring. A plurality of lock engagement surfaces are formed in one of the first and second housings with lock engagement, one surface lockingly engageful with the lock members on the lock.

In one aspect the plurality of lock engagement surfaces are longitudinally spaced within one of first and second housings. The lock engagement surfaces may be recessed grooves. One of the grooves may include a surface extending substantially 360 degrees about an interior of the one of the first and second housings.

Finger grips formed on each of the first and second housings. The finger grips may be axially offset from each other. One of the finger grips includes a wall having a finger grip surface profile. A rib extends between the wall and the first housing. A finger grip profile is formed on one end of the other of the first and second housings.

An exterior gripping surface is formed on the other of the first and second housings to facilitate separation of the first and second housings.

The first and second housings substantially encompass the lock pin when the lock pin is in the locked position. The lock may be a key operated lock.

In another aspect, a lock ring for mounting a watthour meter, or a watthour meter socket adapter or a meter socket enclosure to each other includes a ring shaped member having spaced first and second ends. A lock housing has first and second portions carried on the first and second ends of the ring, respectively. The lock housing receives a lock member in one of a plurality of variably selectable positions that vary the circumference of the ring member to accommodate varying circumference meter mounting flanges.

The lock ring disclosed herein provides a high level of security to resist tampering with the lock ring in an attempt to obtain unauthorized access to non-metered and power in the meter socket. The lock ring can be manufactured of thinner gage material than previous high security lock rings which receive a barrel lock thereby reducing manufacturing costs since the ring can be manufactured in a single machine rather than in multiple machines. The lock ring also eliminates the need for cutouts or scallops in one of the side walls of the ring which are required to facilitate bending of the heavier gage rings used in the past. This eliminates another tampering point since the present lock ring cannot be disengaged from the meter mounting surfaces through a threading movement.

Uniquely, the lock mechanism employed on the lock ring accommodates the lock pin in one of a plurality of variably selectable positions thereby enabling the circumference of the lock ring to be varied to accommodate varying circumference meter mounting flanges while enabling the lock ring to be securely and non-movably mounted about the mounting flanges again eliminating one potential tampering point on the meter.

BRIEF DESCRIPTION OF THE DRAWING

The various features, advantages and other uses of the disclosed lock ring for a watthour meter application will become more apparent by referring to the following detailed description and drawing in which.

DETAILED DESCRIPTION

The present invention, as shown in FIGS. 1-10 is a lock ring 20 which is used to releasably mount a conventional electric watthour meter 21, blank cover, or a simulated meter on a meter socket 22 or watthour meter socket adapter 23. The lock ring 20 may also be employed to releasably mount a watthour meter socket adapter 23 on a watthour meter socket 22.

Figure 1:
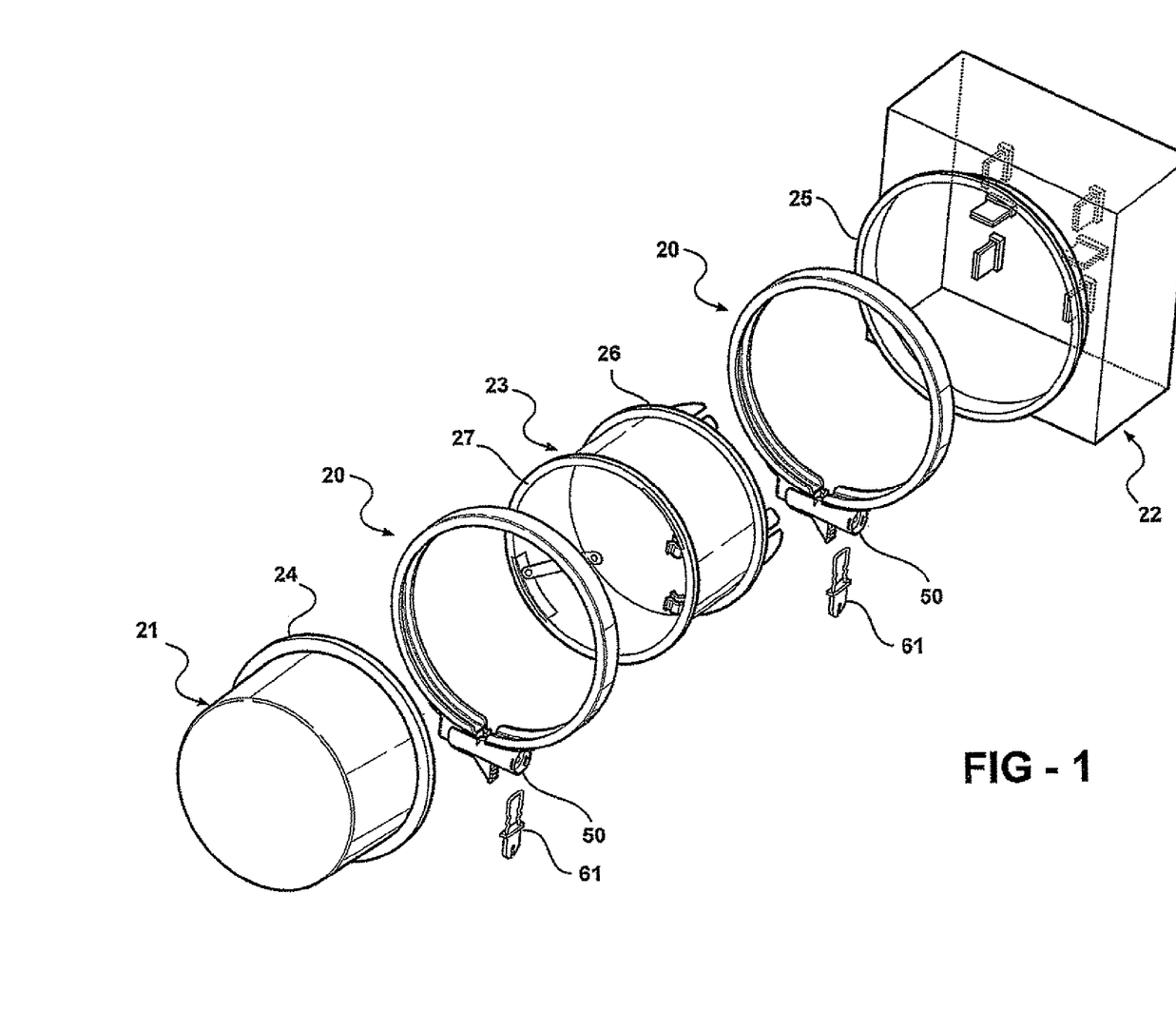
FIG. 1 is an exploded perspective view of a watthour meter enclosure or socket, a watthour meter socket adapter and a watthour meter employing lock rings as disclosed herein.

As is conventional, the electric watthour meter 21, the watthour meter adapter 23, and the watthour meter socket 22 are provided with a mating mounting flanges which abut each other to form an annular surface when, for example, a watthour meter 21 is mounted in a watthour meter socket 22. The watthour meter 21 has a base, ring-shaped mounting flange 24 which is engagable with a similar mounting flange 25 on the cover of the meter socket 22 and/or with a mounting flange 27 on the meter socket adapter 23. A base mounting flange 26 on the meter socket adapter 23 is engagable with the flange 25 on the cover of the meter socket 22. The lock ring 20 is releasably mounted about the mating flanges 24, 27 and/or 26, 25 or 24, 25 and locked in place to securely retain the watthour meter 21 on the watthour meter socket 22, or to retain the watthour meter socket adapter 23 on the watthour meter socket 22 or to retain the watthour meter 21 on the watthour meter socket adapter 23.

Figure 2:
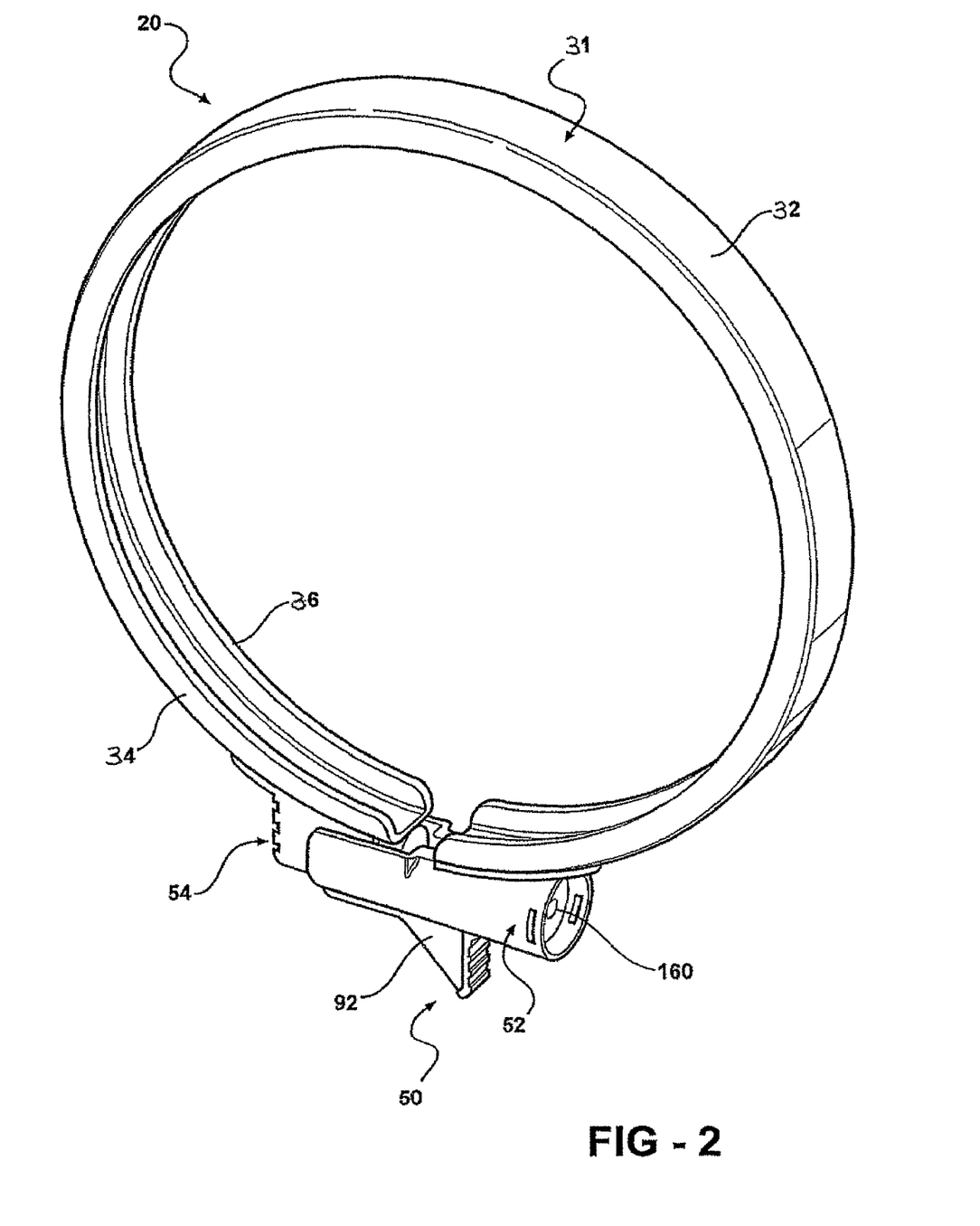
FIG. 2 is a perspective view of a lock ring shown in FIG. 1.

The lock ring 20, as shown in greater detail in FIG. 2, is in the form of an annular band 31 having a generally U-shaped cross section formed by a planar central wall 32 and two side flanges 34 and 36. The width of the central wall 32 and the length of the side flanges 34 and 36 are selected to snugly fit around the engaged mounting flange of the watthour meter 21, the watthour meter socket adapter 23 and/or the watthour meter socket 22. The annular band 31 is formed of any suitable material, such as a metallic material, i.e., steel or aluminum. Stainless steel may be employed to form the band 31.

The annular band 31 is formed with first and second spaced ends 38 and 40, respectively. The first and second ends 38 and 40 will normally be brought into close proximity when the sealing ring 20 is lockingly mounted about the mating mounting flanges. Conversely, the first and second ends 38 and 40 may be separated when the lock mechanism employed on the lock ring 20, as described hereafter, is released enabling the diameter of the lock ring 20 to be enlarged so as to permit the lock ring 20 to be removed from the mounting flanges.

It will understood that the ceiling or lock ring 20, as disclosed herein and shown in FIG. 1, may be used solely to mount a watthour meter 21 to the mounting flange on a ring style meter socket cover or to attach a watthour meter socket adapter 23 to the mounting flange of the ring style meter socket cover and as depicted in FIG. 2, to secure the mating mounting flanges of a watthour meter to a socket adapter 23.

Figure 3:
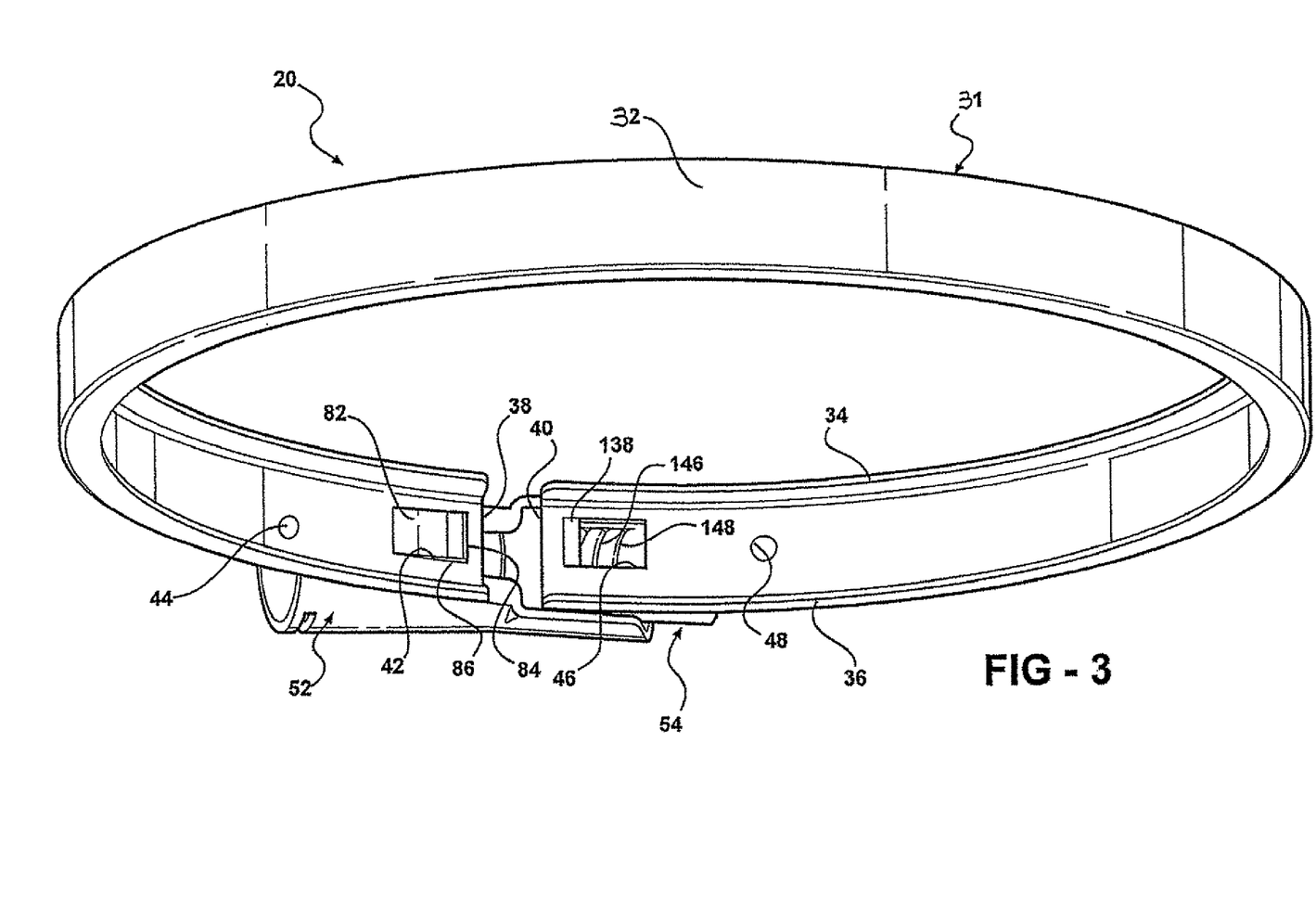
FIG. 3 is an enlarged, partial, perspective view of the lock ring shown in FIG. 2.

As shown in FIG. 3, apertures 42 and 44 are formed in the wall 22 of the watthour meter 21 adjacent the first and second ends 38 and 40 for use in securing a lock mechanism to the band 31. By way of example only, a first aperture 42 which has a generally rectangular shape, by way of example only, and a second aperture 44, typically having a circular cross section, again by way of example only, are spaced from the first end 38 from the band 31, with the aperture 42 being located closer to the first end 38 in the aperture 44.

Similarly, generally rectangular aperture 46 and a circular aperture 48 are consecutively spaced from the second end 40 of the band 31. Both of the apertures 42 and 46 may have inward tapering side edges.

Figure 4:
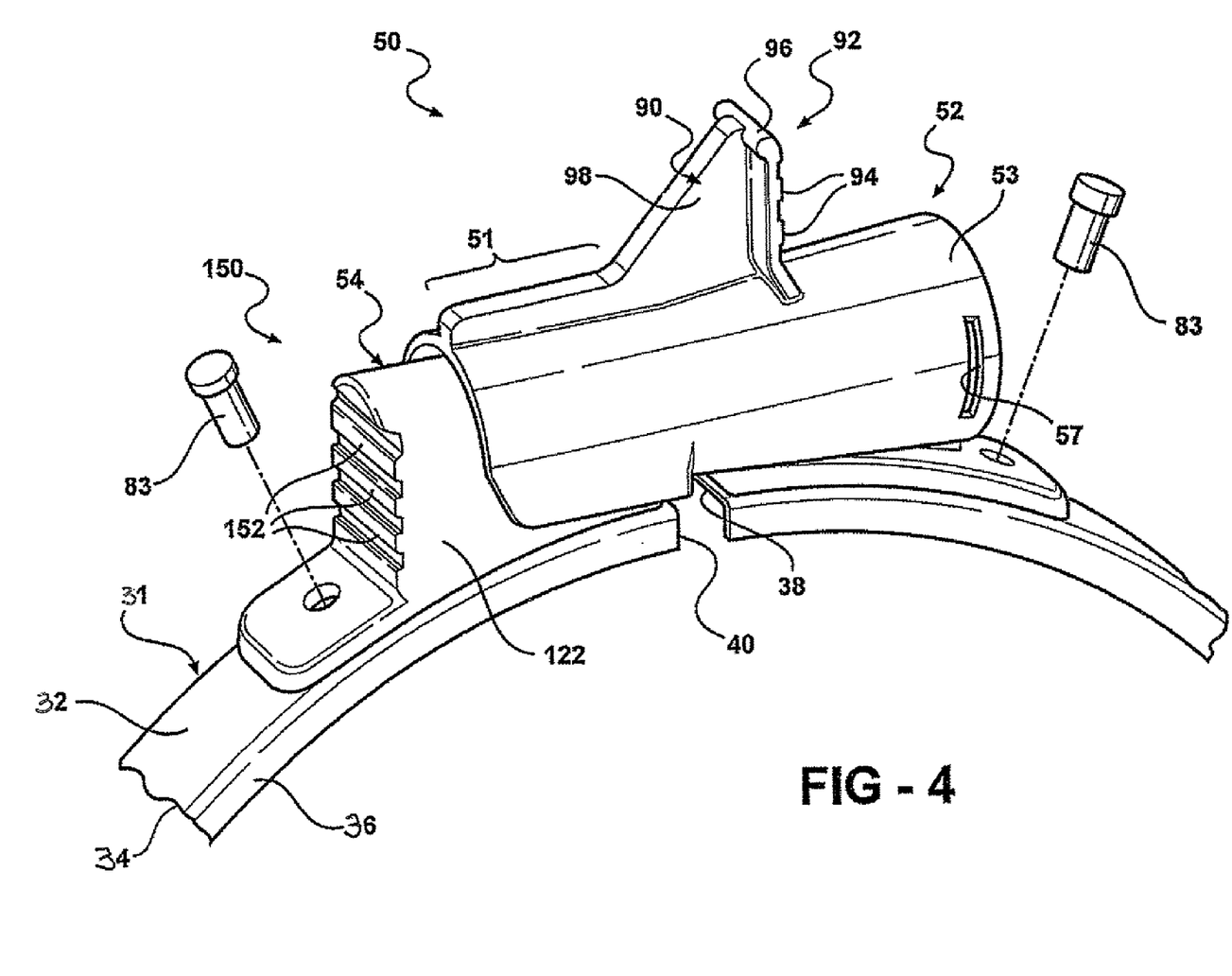
FIG. 4 is a perspective view of the lock mechanism used in the lock ring shown in FIG. 2.

A releasable lock mechanism 50 is carried on the lock ring 20. As generally shown in FIG. 4, and in greater detail in FIGS. 5-10, the lock mechanism 50 includes a housing 51 including first member 52 and a second member 54. The first and second members 52 and 54 are telescopically engagable, with one portion of the first member 52 being slidable over a portion of the exterior of the second member 54 as shown in FIG. 4.

Each of the first and second members 52 and 54 is formed of a suitable high strength material. Although the lock members 52 and 54 may be machined from a suitable metal or plastic to the desired shape, the first and second lock members 52 and 54 may also be manufactured from a moldable metal, such as steel, stainless steel or die cast zinc, as well as a high strength plastic.

Figure 5:
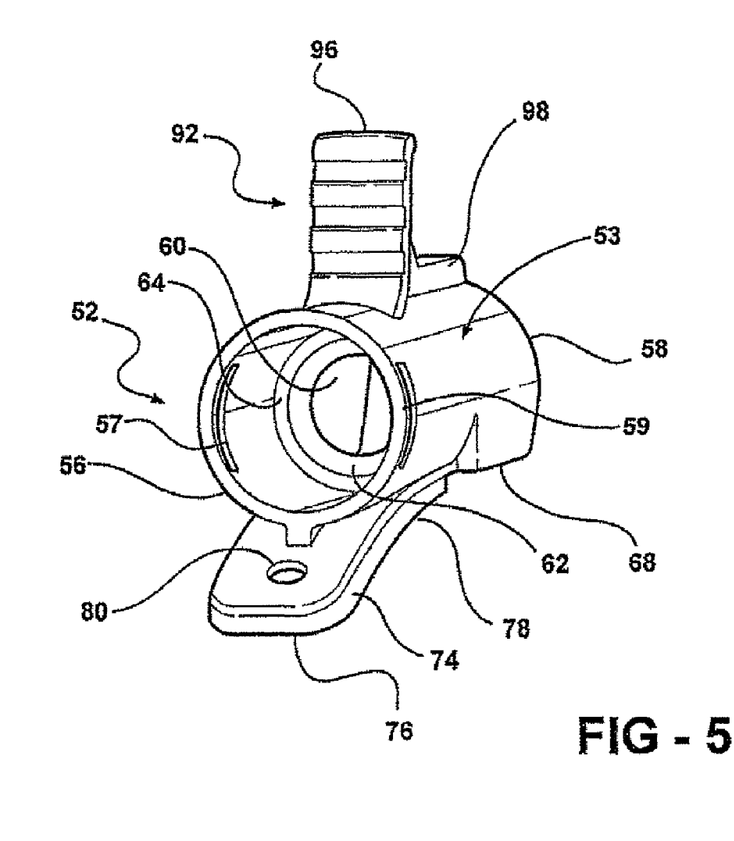
FIG. 5 is a right end perspective view of one of the lock mechanism members shown in FIG. 4.
Figure 6:
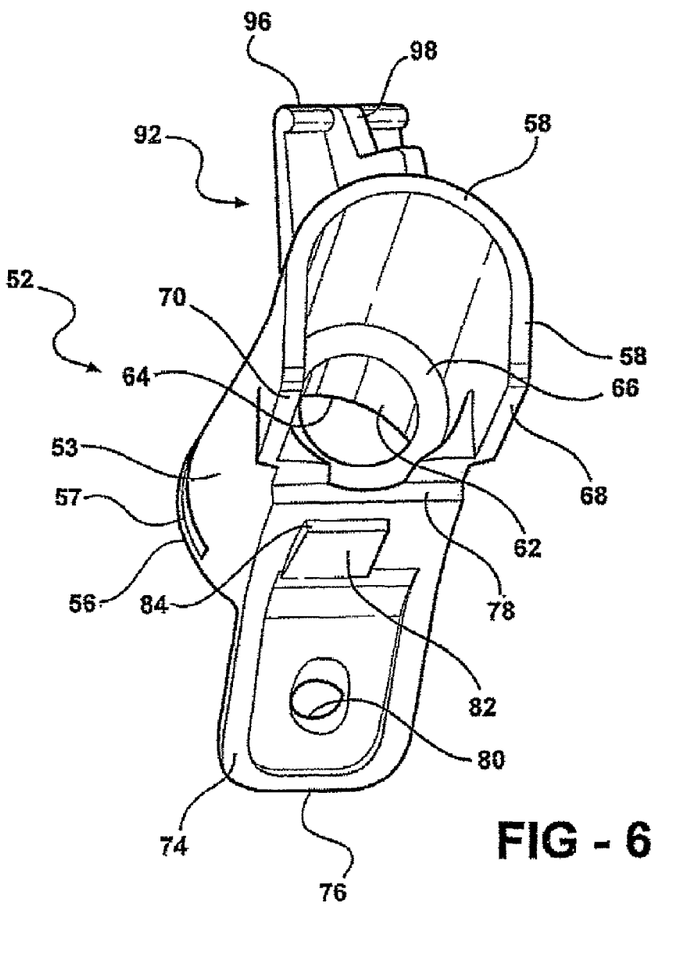
FIG. 6 is a opposite end perspective view of the lock mechanism member shown in FIG. 5.

As shown in detail in FIGS. 5 and 6, the first member 52 includes a body having a first end 56 and an opposed second end 58. A bore 60 extends through the body 53 of the first member 52 between the first and second ends 56 and 58.

An annular collar 62 is disposed intermediately in the bore 60 between the first and second ends 56 and 58 to form first and second annular shoulders 64 and 66. The shoulders 64 and 66 act as stops or insertion limit surfaces for the second member 54 as well as for the lock pin as described hereafter.

The body 53 of the first member 52 has a generally circular, cylindrical or gradually radially decreasing diameter shape extending from the first end 56 to an intermediate portion, generally in the vicinity of the collar 62. From this intermediate point, the body 53 has an exterior discontinuity of a predetermined angular extent forming opposed side walls 68 and 70 extending from the vicinity of the shoulder 66 to the second end 58. The discontinuity which forms edges of the sidewalls 68 and 70 is by way of example only, but functions to the allow the first lock member 52 to slide over a portion of the exterior of the second lock member 54.

A generally arcuate base 74 is carried by the body 53 and generally underlays the first cylindrical portion of the body 53. The base 74 has opposed first and second ends 76 and 78, respectively. An aperture 80 is formed adjacent the first end 76. A downward extending projection 82 having a lip or edge 84 is formed on the underside of the base 74 and spaced from the second end 78 of the base 74.

Although the projection 82 can take a variety of configurations, by way of example only, the projection 82 has substantially the same exterior shape and dimensions as the first aperture 42 adjacent the first end 38 of the band 31. The opposed sides 86 of the projection 82 may taper to a narrower dimension between opposed ends of the projection 82 to snugly fit within the aperture 42, with the lip 84 on the projection 82 extending through the aperture 42 within the interior of the band 31 between the side walls 34 and 36.

The projection 82 snugly fits within the aperture 42 and acts as a part of a mount to secure the first lock member 52 to the wall 22 of the band 31 in conjunction with a fastener, such as a rivet, bolt 83 etc., seen in FIG. 4, which is inserted through the aligned apertures 44 and 80 in the band 31 and the base 74.

A first finger grip 90 is carried on the first member 52 by means of separate attachment to the first member 52, integrally molded as a unitary part of the first member 52, etc. The first finger grip 90 is formed with a gripping surface 92 formed by a plurality of spaced ribs 94 which are carried on a wall 96 extending radially outward from the exterior surface of the body 53 of the first member 52. A rib 98 may be optionally provided between the wall 94 and the exterior surface of the body 53 to resist movement of the wall 96 during use of the first finger grip 90.

Figure 7:
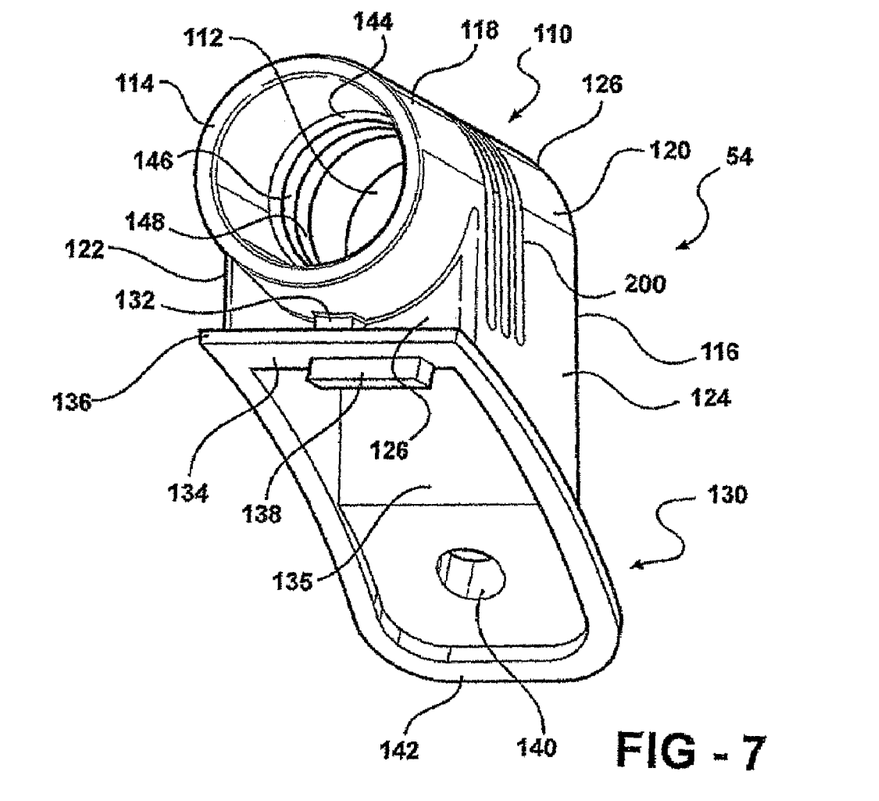
FIG. 7 is a right end perspective view of the other lock mechanism member shown in FIG. 4.
Figure 8:
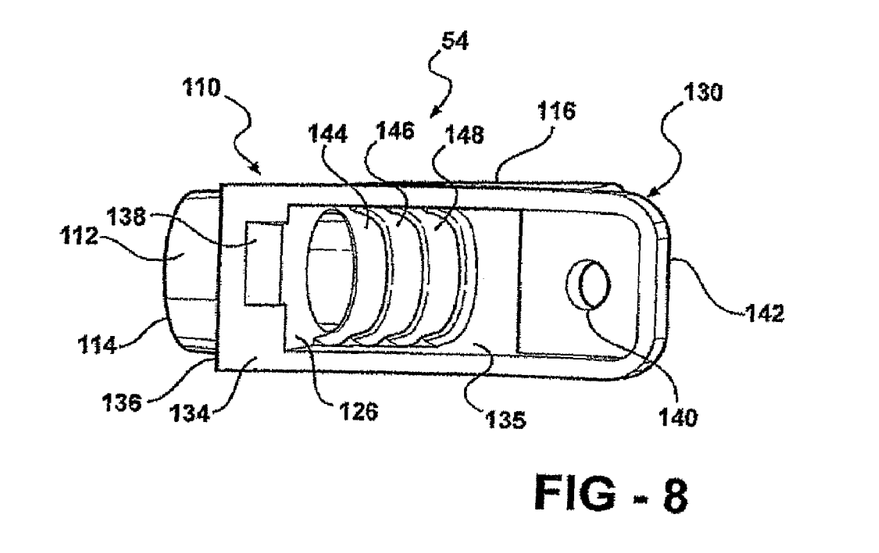
FIG. 8 is a bottom perspective view of the lock mechanism member shown in FIG. 7.

As shown in detail FIGS. 7 and 8, the second member 54 includes a body 110 having a bore 112 extending therethrough between first and second ends 114 and 116, respectively. The body 110 includes a generally cylindrical first body portion 118 extending from the first end 114.

A second body portion 120 extends from the first portion 118 to the second end 116 of the body 110. The second end portion 120 is formed of opposed, generally linear side walls 122 and 124 which are joined by an arcuate end wall 126 which forms an upper, outer portion of the second portion 120 of the body 110. An end wall 126 is formed at the transition between the first and second body portions 118 and 120 as shown in FIG. 7.

A base 130 is carried on the body 110 and is affixed to or integrally formed as a unitary part of the edges of the side walls 122 and 124 of the second portion 120 and is connected to the first portion 118 by a rib 132 by way of example. The bottom or inner portion of the second portion 120 of the body 110, taken in a mounting position as shown in FIG. 7, defines an opening between a first edge 134 adjacent a first end 136 of the base 130. A projection 138 is formed on the edge 134 and has a lateral shape substantially the same as the lateral width and shape of the aperture 46 in the band 31 as shown in FIG. 3. The lateral sides of the projection 138 may be tapered from end to end to match the tapered sides of aperture 46 to prevent movement of the projection 138 in the aperture 46. This enables the projection 138 to fit snuggly within the aperture 46 to aid in locating and mounting the second member 54 on the band 31 adjacent the second end 40 of the band 31. An aperture 140 is formed in a solid portion of the base 130 spaced from a second end 142 of the base 130 and, when aligned with the aperture 48 in the band 31 receives a fastener, such as a rivet, bolt, screw, etc., to securely, yet removably affix the second member 54 to the band 31.

As shown in FIG. 8, a plurality, which may be two or more, with three recesses or grooves 144, 146 and 148 being shown by way of example only, are formed within the interior of the body 110 of the second lock member 54 generally consecutively from the wall 126 between the first and second body portions 118 and 120. The recesses or grooves 144, 146 and 148 which extend approximately 180 degrees or slightly more around the interior of the body 110 define variably selectable positions for the lock pin to enable the circumference of the band 31 to be varied to accommodate different circumference mounting flanges on a watthour meter, meter socket cover or meter socket adapter in a tight, snug, non-movable fit.

Figure 10:
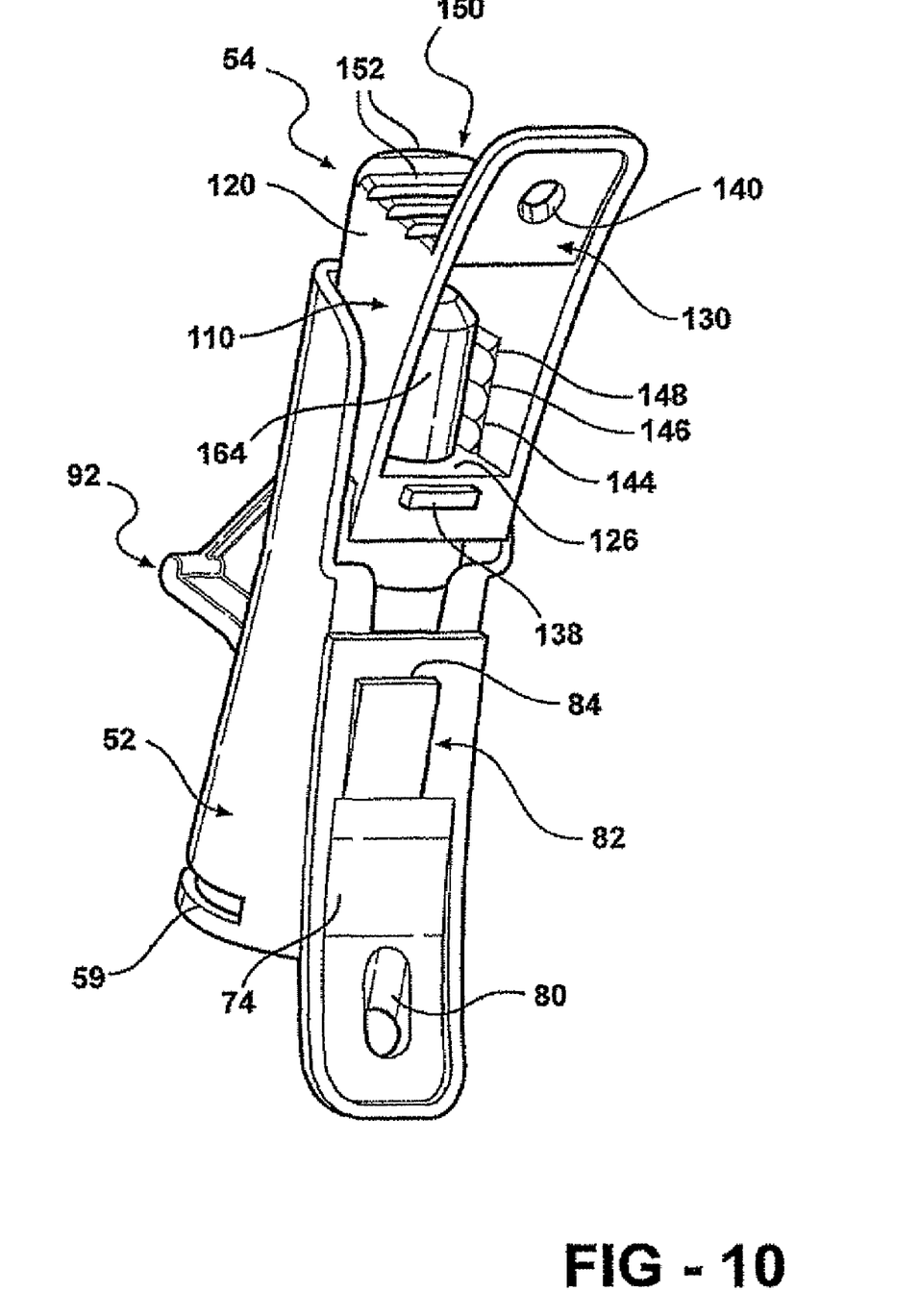
FIG. 10 is a bottom perspective view showing the lock mechanism and the lock pin the fully locked position.

A second finger grip 150 is formed on a closed end of the second portion 120 of the body 110 of the second member 54, as shown in FIG. 10. The second finger grip 150 is defined by a plurality of outward projecting grip surfaces 152 which are spaced apart along the end wall of the second portion 120. As shown in FIG. 4, the first and second finger grips 90 and 150 are axially offset to allow insertion and removal of the lock pin through the first end 56 of the first lock member 52.

Figure 9:
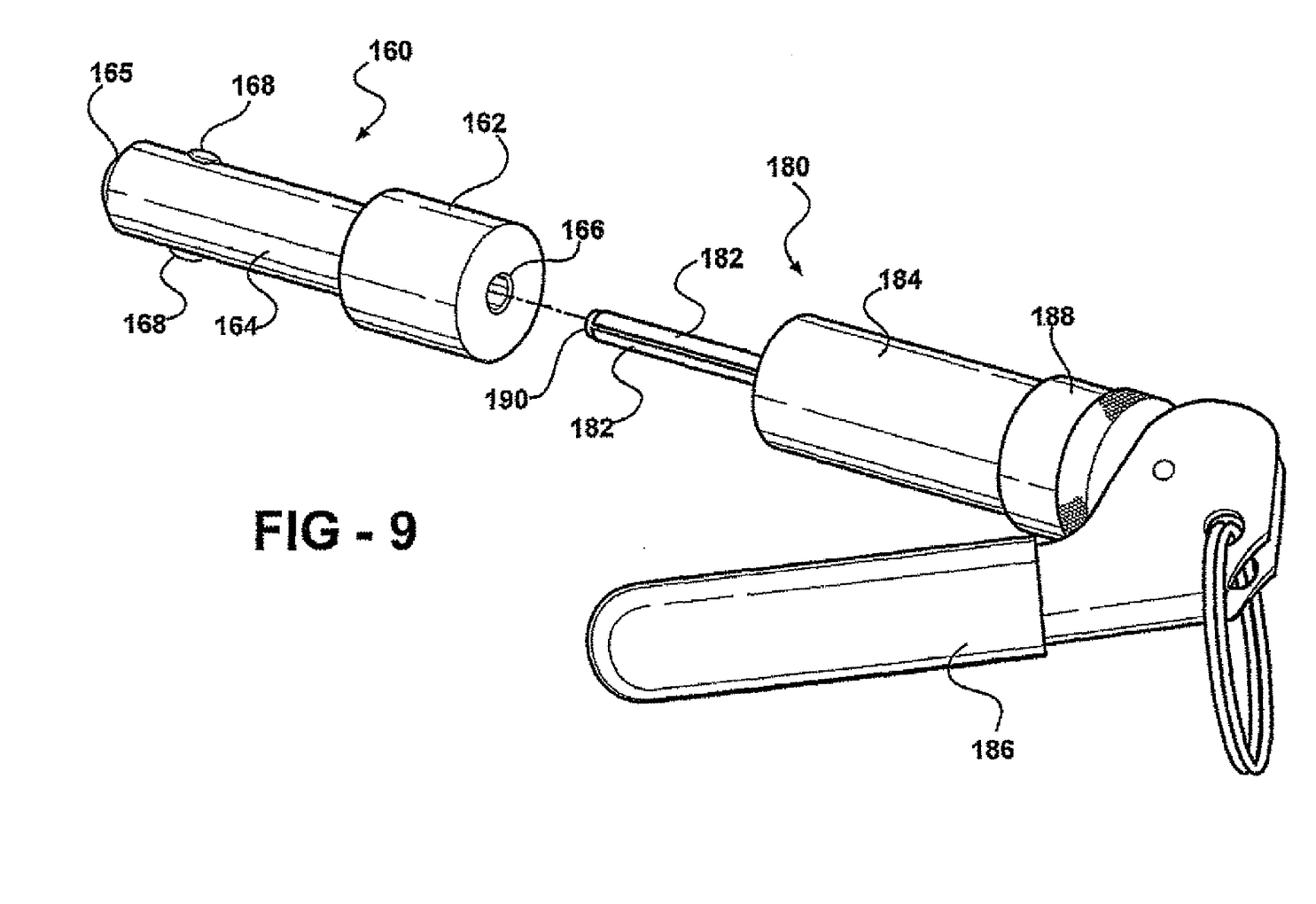
FIG. 9 is a perspective view of the lock pin used in the lock mechanism shown in FIG. 2.

A lock pin 160, shown generally in FIGS. 9 and 10, is formed similar to lock pins typically employed in watthour meter barrel locks. The lock pin 160 is typically of one piece construction and includes a head 162 and a shank 164. A bore extends through the head 162 and a major portion of the length of the shank 164 from an open first end 166 in the head 162.

A pair of radially moveable lock balls 168 are carried in recesses in the shank 164 is typical, a longitudinally moveable plunger, not shown, with a pair of opposed recesses is mounted within the bore of the shank 164. The plunger is engageable by a lock key 180 which has a pair of expandable arms 182 disposed within a shaft 184. A handle 186 is pivotally connected to a head portion 188 of the shaft 184 and is connected to an internally mounted rod 190 which forces the ends of the arms 182 toward and away from each other as the rod 190 is extended or withdrawn relative to the shaft 184 during pivotal movement of the handle 186.

In operation, the arms 182, when in the retracted, close together position shown in FIG. 9, can be inserted through the first open end 166 into the bore in the lock pin 160. Pivotal movement of the handle 186 from the first position shown in FIG. 10 to a second position withdraws the rod 190 into the shaft 184 causing the ends of the arms 182 to be forced apart and expand gripping the plunger within the shank 164 of the lock pin 160 and causing the plunger to slide within the bore in the shank 164 toward the head 162. This brings the recesses in the plunger into alignment with the lock balls 168 allowing the lock balls 168 to retract inwardly toward the plunger 164 for sliding insertion of the lock pin 160 into the aligned members 52 and 54 of the lock mechanism 50.

Opposite pivotal movement of the handle 186 extends the rod 190 and draws the expanded ends of the arms 182 toward each other into close engagement. This disengages the lock key 180 from the lock pin 160 and forces the plunger in the shank 164 of the lock pin 160 toward the end 165 moving the lock balls 168 out of the recesses in the plunger and locking the lock balls 168 in the outward position shown in FIG. 10 which defines the lock position of the lock pin 160 in the lock mechanism 50.

Prior to insertion of the lock pin 160, the band 31 is fitted about the mating mounting flanges of a watthour meter socket cover 22 and a watthour meter 21 or socket adapter 23 or between the mated mounting flanges of a watthour meter socket adapter 23 and a watthour meter 21 as shown in FIG. 1. The first and second members 52 and 54 are engaged by the user's fingers on the finger grips 90 and 150 to urge the first and second members 52 and 54 together, with the second end portion of the first member 52 sliding over the exterior of the second member 54 until the surface 64 of the collar 62 in the first member 52 contacts the first end 114 of the second member 54. At this time, the lock pin 160 can be inserted through the first end of the first member 52 until the lock balls 168 are in the desired position in one of the recesses 144, 146 and 148 in the second member 54. The handle 186 on the lock key 180 is pivoted to drive the lock balls outward into fixed engagement with the selected recess 144, 146 or 148 in the second member. At this time, the lock key 180 is removed from the lock pin 160 after the lock pin 160 has been secured in the mated members 52 and 54 with the shoulder formed between the head 162 and the shank 164 of the lock pin 160 engaging the shoulder 66 of the collar 62 in the first lock member 52.

A pair of diametrically opposed apertures, shown as slots 57 and 59, are formed in the first portion of the body 53 of the first member 52 adjacent the first end 56. The slots 57 and 59 receive a plastic or wire seal 61, FIG. 1, such as a plastic or wire seal sold by E. J. Brooks Co. of New Jersey, to be inserted therethrough and locked together as a seal or tampering indicator across the open first end 56 of the first member 52 after the first and second lock members 52 and 54 have been joined together by the lock pin 160 as described above.

Removal of the lock ring 20 involves a reverse operation in which the lock key 180 is inserted into the bore in the lock pin 160 and the handle 186 pivoted to retract the lock balls 168 from engagement of one of the recesses 144, 146 and 148 in the second member 54. At this time, the entire lock pin 160 can be removed through the open first end 58 of the first member 52.

As clearly shown in FIG. 4, it will be understood that when the lock ring 20 is secured about the mating flanges of the watthour meter socket cover 22, watthour meter 21, and/or watthour meter socket adapter 23, the lock pin 160 is completely disposes within and covered by the overlapping members 52 and 54. This minimizes attempts to tamper with the lock pin 160 to effect its removal from the lock ring 20 and thereby removal of the lock ring 20 itself and the watthour meter 21 from the socket cover for an authorized access to the interior of the watthour meter socket 22.

As shown in FIG. 7, exteriorly opening grooves 200 may be formed in one or both of the lock members 52 and 54, with the grooves 200 shown by way of example only on the sidewalls 122 and 124 of the second member 54. The exterior grooves 200, which may take any shape, act as an optional finger grip surface to facilitate separation of the members 52 and 54 from each other and separation of the ends 38 and 40 of the band 31 to enable removal of the ring 20 from the mating flanges.

What is claimed is:

1. A watthour meter mounting apparatus comprising:
   a barrel lock including a head, a shank, and at least one moveable lock member carried on the shank;
   a lock ring having first and second circumferentially movable ends for varying the circumference of the lock ring to accommodate varying circumference watthour meter mounting flanges;
   a lock housing including first and second members on the first and second ends, respectively, of the lock ring, the members being separate from the lock ring and attached on an outer circular surface portion of the lock ring; and
   a plurality of axially spaced, distinct lock engagement surfaces formed in the second member selectively lockingly engageable with the at least one lock member on the barrel lock when the barrel lock is inserted through the first member into the second member.

2. The apparatus of claim 1 wherein:
   the lock engagement surfaces are recessed grooves.

3. The apparatus of claim 1 further comprising:
   a finger grip surface formed on at least one of the first and second members.

4. The apparatus of claim 1 further comprising:
   a finger grip surface formed on each of the first and second members, the finger grip surfaces being axially spaced from each other.

5. The apparatus of claim 3 wherein:
   the finger grip surface includes a wall having a finger grip surface profile; and
   a rib extending between the wall and the first member.

6. The apparatus of claim 1 further comprising:
   an exterior gripping surface formed on at least one of the first and second members to facilitate separation of the first and second members.

7. The apparatus of claim 1 wherein:
   the first and second members encompass the barrel lock when the barrel lock is in the locked position.

8. The apparatus of claim 1 wherein:
   the barrel lock is a key operated lock.

9. The apparatus of claim 7 wherein one of the first and second members is slidable over the other of the first and second members when the first and second members are in a locked position by the barrel lock to substantially encompass opposed facing ends of the first and second members.

* * * * *